(12) United States Patent
Chen et al.

(10) Patent No.: US 7,501,348 B2
(45) Date of Patent: Mar. 10, 2009

(54) METHOD FOR FORMING A SEMICONDUCTOR STRUCTURE HAVING NANOMETER LINE-WIDTH

(75) Inventors: Szu-Hung Chen, Hsinchu (TW); Yi-Chung Lien, Hsinchu (TW); Yi Edward Chang, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 7 days.

(21) Appl. No.: 11/783,470

(22) Filed: Apr. 10, 2007

(65) Prior Publication Data

US 2008/0254632 A1    Oct. 16, 2008

(51) Int. Cl.
*H01L 21/302* (2006.01)
*H01L 21/461* (2006.01)

(52) U.S. Cl. ............... 438/706; 438/574; 257/E21.218; 257/E21.231; 257/E21.229; 257/E21.245

(58) Field of Classification Search ................. 438/574, 438/637, 657, 700, 706
See application file for complete search history.

(56) References Cited

U.S. PATENT DOCUMENTS

| | | | | |
|---|---|---|---|---|
| 4,551,905 A | * | 11/1985 | Chao et al. | 438/570 |
| 4,687,730 A | * | 8/1987 | Eron | 430/324 |
| 5,432,698 A | * | 7/1995 | Fujita | 600/301 |
| 5,652,179 A | * | 7/1997 | Strifler et al. | 438/578 |
| 5,766,993 A | * | 6/1998 | Tseng | 438/253 |
| 6,001,681 A | * | 12/1999 | Liu et al. | 438/238 |

* cited by examiner

*Primary Examiner*—David Nhu
(74) *Attorney, Agent, or Firm*—Bacon & Thomas PLLC

(57) ABSTRACT

A method for forming a semiconductor structure having a deep sub-micron or nano scale line-width is disclosed. Structure consisting of multiple photoresist layers is first formed on the substrate, then patterned using adequate exposure energy and development condition so that the bottom photoresist layer is not developed while the first under-cut resist groove is formed on top of the bottom photoresist layer. Anisotropic etching is then performed at a proper angle to the normal of the substrate surface, and a second resist groove is formed by the anisotropic etching. Finally, the metal evaporation process and the lift-off process are carried out and the Γ-shaped metal gate with nano scale line-width can be formed.

7 Claims, 7 Drawing Sheets

METHOD FOR FORMING A SEMICONDUCTOR STRUCTURE HAVING NANOMETER LINE-WIDTH

BACKGROUND OF THE INVENTION

1. Field of the Invention

The invention relates to forming a semiconductor structure, more particularly for forming a semiconductor structure having a deep sub-micron line-width.

2. Description of the Prior Art

The semiconductor technology right now is still highly researched and developed to improve the current semiconductor device performance; also, deep sub-micron scale or so-called nano-scale line-width metal electrode technology is a key technology for semiconductor device manufacturing and could become much more important when the device dimension continues being downscaled. The previous sub-micron scale line-width metal electrode technology all can be carried out by the photolithography technology. However, forming deep sub-micron scale or so-called nano scale metal electrode using conventional photolithography technology is more challenging.

At the present day, for deep sub-micron technology development, optical lithography combined with the Phase-Shift Mask (PSM), extreme ultraviolet lithography (EUVL) or electron-beam Lithography (EBL) all can be used for the exposure process with the main purpose of shrinking down the line-width. Nevertheless, the investment cost of the hardware equipment, maintenance or materials will be highly increased. In addition, for EBL, the throughput is an issue that may become practical concern for the industrial mass production. As a result, technologies targeting deep sub-micron or nano scale resolution without using any expensive phase-shift mask or advanced lithography equipments are indispensably required for reducing production cost.

For high-frequency applications, device having sub-micron or nanometer gate with mushroom cross-section will be necessary. The mushroom gate is with small footprint for a short gate length and with large cross-sectional area in the top for lower gate resistance. This can simultaneously avoid parasitic resistances and achieve better performance at high frequencies. A wide variety of mushroom type gates including T, Γ, or Y shaped gates have been demonstrated successfully to improve device performances at microwave or millimeter-wave frequencies.

About the photolithography technology related principium in the semiconductor field, photoresist mask for protecting the underneath semiconductor from etching or ion implanted will be firstly defined and formed, and then selectively etching step or implantation step will be proceeded.

Normally, the character of photoresist under lighting will be changed due to the light energy. For positive photoresist, after being exposed, the bonding of the positive photoresist will be interrupted, then the positive photoresist will be solved under the develop step. The un-exposed portion of the positive photoresist will be retained, as the acid-resisting armor layer. For the negative photoresist, after the negative photoresist under being exposed, the bonding of the negative photoresist will be connected, then the negative photoresist will be retained under the develop step. The un-exposed portion of the negative photoresist will be solved.

Furthermore, for better understanding of prior techniques related to sub-micron or deep sub-micron gate patterning, efforts were made to carry out literature study and patent search. Related prior arts are described and discussed in the followings:

In U.S. Pat. No. 4,532,698, "Method of making ultrashort FET using oblique angle metal deposition and ion implantation", multiple tilt-angle metal evaporation steps and multiple etching steps are performed to remove the residual surface metal. However, it is not easy to control the line-width and the overall process is quit complex. Furthermore, it is not easy to realize T-type or Γ-type gate formation by this technique.

In U.S. Pat. No. 4,687,730, "Lift-off technique for producing metal pattern using single photoresist processing and oblique angle metal deposition", the method only used a single layer of photoresist and partially development was carried out to form photoresist groove. Partially development is not easy to control when compared to the selective development in the multi-layer resist structure. Furthermore, it is not easy to realize T-type or Γ-type gate formation by this technique. The overall process is relatively simple when compared to the present advanced technology. However, its application still would be quite limited.

In U.S. Pat. No. 5,652,179, "Method of fabricating sub-micron gate electrode by angle and direct evaporation", vertical anisotropic etching process and multiple metal evaporations, including twice tilt-angle metal evaporation steps and a vertical metal evaporation step, were used. Finally, the assisted metal pattern has to be removed. Although Γ type gate with sub-micron line-width can be formed, the process steps are more complex. The method disclosed in this invention is time-consuming and with higher production cost.

Therefore, new technology with simple process steps, lower production cost and sub-micron line-width capability will be urgently required as the time cost or performance factors are essential considerations for mass production in semiconductor industry.

SUMMARY OF THE INVENTION

In accordance with the present invention, a method for forming a semiconductor structure having a deep sub-micron line-width is provided as follows.

In the first embodiment, firstly, the first photoresist layer and the second photoresist layer are sequentially formed on the semiconductor substrate by the coating process.

Then, the photoresist structure is patterned using adequate exposure energy and development condition so that the underlying first photoresist layer is not developed while an under-cut photoresist groove is formed on top of the first photoresist layer.

Anisotropic etching with a proper angle, such as a tilt angle to the normal line of the substrate surface will be then performed. The edge of the under-cut groove can shield a portion of the first photoresist layer from being etched during the etching process.

Part of the first photoresist layer is etched to form an opening, which defines the footprint of the metal electrode after direct metal evaporation and lift-off process.

The invention provides a simple and cost-effective process for the fabrication of Γ-shaped gate with deep sub-micron gate length by simply using conventional optical lithography and angled anisotropic etching process.

Furthermore, in the second embodiment, firstly, the first photoresist layer, the second photoresist layer and the third photoresist layer are sequentially formed on the semiconductor substrate by the coating process.

Then, the photoresist structure is patterned using adequate exposure energy and development condition so that the underlying first photoresist layer is not developed while an under-cut resist groove is formed on top of the first photoresist layer.

Anisotropic etching will be then performed with a proper angle, such as a tilt angle to the normal line of the substrate surface. The edge of the under-cut groove can shield a portion of the first photoresist layer from being etched during the etching process.

Part of the first photoresist layer is etched to form an opening, which defines the footprint of the metal electrode after direct metal evaporation and lift-off process.

This method also provides a simple and cost-effective process for the fabrication of Γ-shaped gate with deep sub-micron gate length simply using conventional optical lithography and anisotropic etching process.

In summary, this invention disclose methods for fabricating Γ-shaped gates with nanometer gate lengths by sequentially performing exposure of multi-layer photoresist structure by conventional photolithography, selectively development process and using tilt-angle anisotropic etching. The disclosed methods are simple, cost-effective and competitive for using in high-frequency device fabrications.

BRIEF DESCRIPTION OF THE DRAWINGS

The foregoing aspects and many of the attendant advantages of this invention will become more readily appreciated as the same becomes better understood by referring to the following detailed description, when taken in conjunction with the accompanying drawings, wherein.

DESCRIPTION OF THE PREFERRED EMBODIMENT

The following is a description of the present invention and the invention will firstly be described with reference to one exemplary structure. Some variations will then be described as well as the advantages of the present invention. A preferred method of fabrication will then be discussed; also, an alternate, asymmetric embodiment will then be described along with the variations in the process flow.

The technology provided by the invention is for solving the issues met in the fabrication of deep sub-micron or nano scale line-width in the semiconductor industry. The invention only needs conventional semiconductor equipments for use, such as I-line stepper or DUV contact aligner, in order to achieve the purpose for forming patterns with small feature size via a relatively simple and cost-effective method. Therefore the methods disclosed in this invention are suitable for mass production in the industrial for the manufacture of deep sub-micron or nano scale high-speed electronic components.

The methods for forming the deep sub-micron or nano scale line-width semiconductor structure are disclosed as followings.

Figure 1A:
FIGS. 1A to 1F are the production process schematically illustrating the first embodiment of the invention.

In the first embodiment, as shown in FIG. 1A, firstly, after considering the materials character and photo sensitivity, a suitable photoresist is selected for the first photoresist layer 102 which is formed on the semiconductor substrate 101 by the coating process.

Figure 1B:
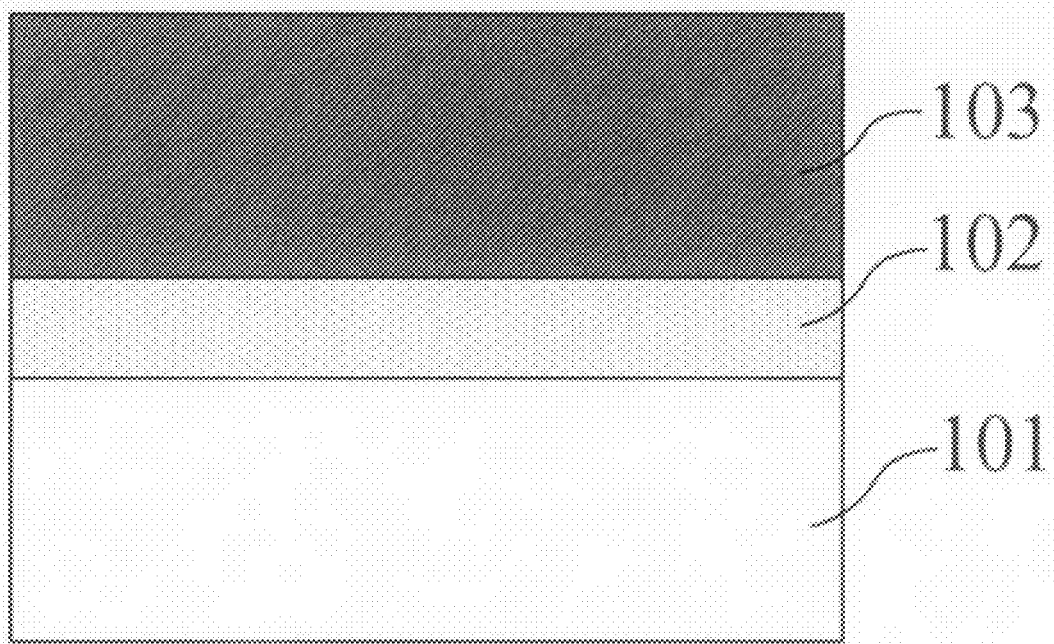

As shown in FIG. 1B, secondly, after considering the materials character and photo sensitivity, a suitable photoresist is selected for the second photoresist layer 103. The second photoresist layer 103 is formed on the first photoresist layer 102 by the coating process. Here, the materials character and photo sensitivity for the first photoresist 102 is different with that of the second photoresist layer 103.

Figure 1C:
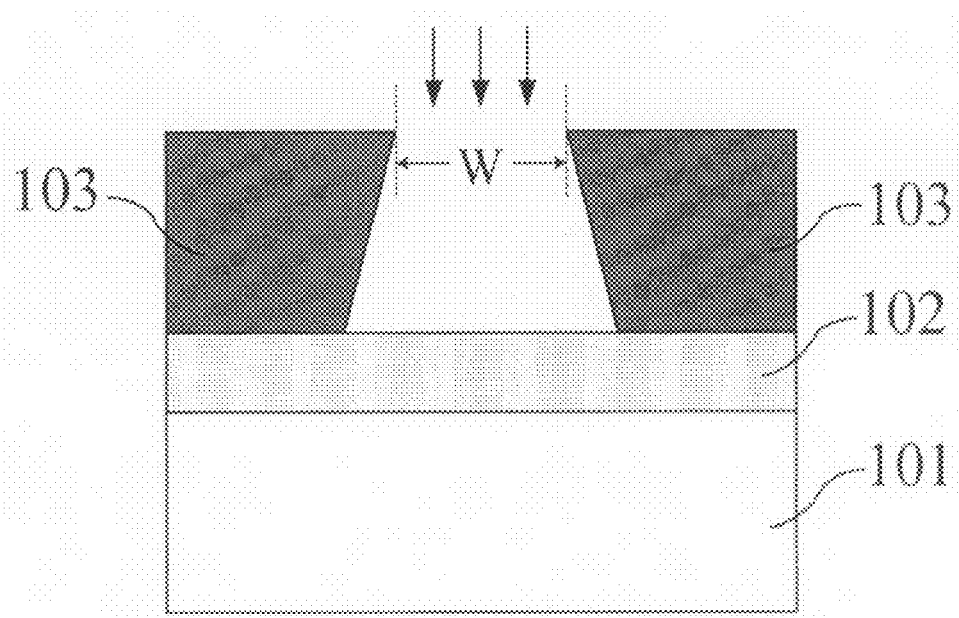

Sequentially, as shown in FIG. 1C, the exposure procedure of the selective developing process will be carried out. Controlling the expose energy, the expose dose is higher than the critical expose dose of the second photoresist layer 103 but lower than the critical expose dose of the first photoresist layer 102. The first photoresist layer 102 will not be developed after the second photoresist 103 being adequately developed and forming an under-cut photoresist groove having a top opening of W.

Figure 1D:
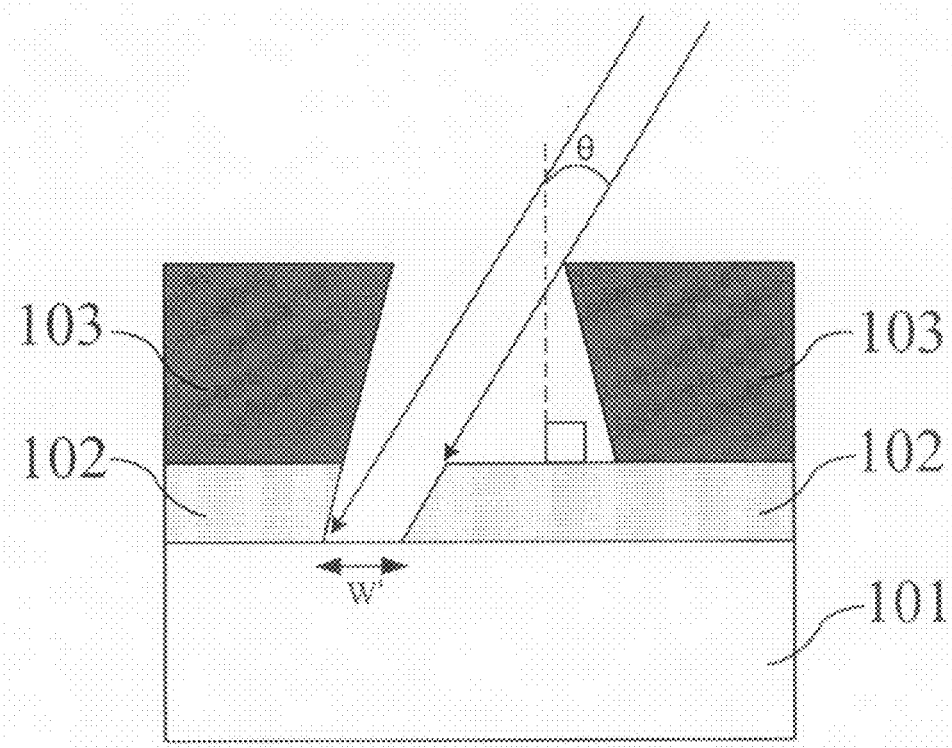

As shown in FIG. 1D, anisotropic etching is carried out using dry etching with a proper angle, such as a controlled tilt-angle θ, i.e. there is an included angle to a normal line of the substrate surface. The first photoresist layer 102 is etched using the second photoresist layer 103 as the mask, so that a bottom photoresist groove with feature size of $W'$ can be obtained, wherein $W'$ is smaller than W.

Figure 1E:
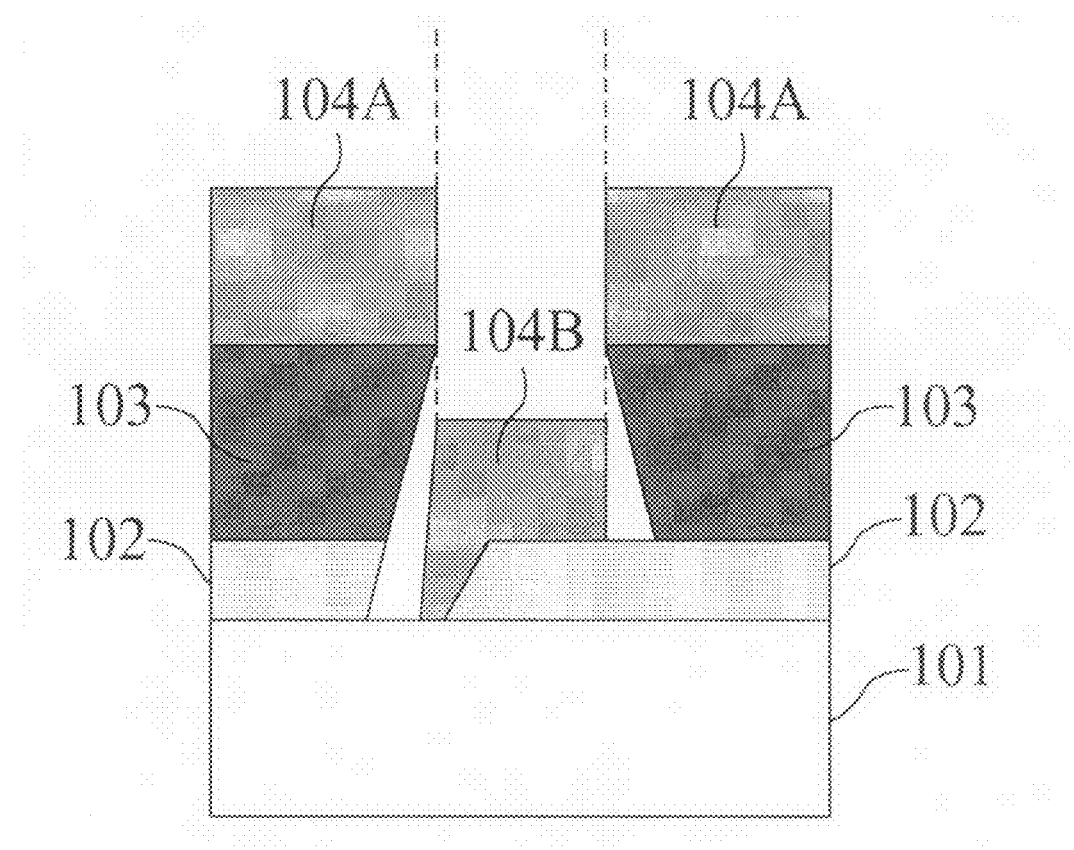

Next, as shown in FIG. 1E, the metal evaporation process is carried out by using equipments such as Electron Beam Evaporator for forming the first portion of metal layer 104A and the second portion of metal layer 104B. Wherein, the first portion of metal layer 104A will cover the surface of the second photoresist layer 103, the second portion of metal layer 104B will cover the surface of first photoresist layer 102 and the surface of the semiconductor substrate 101.

Figure 1F:
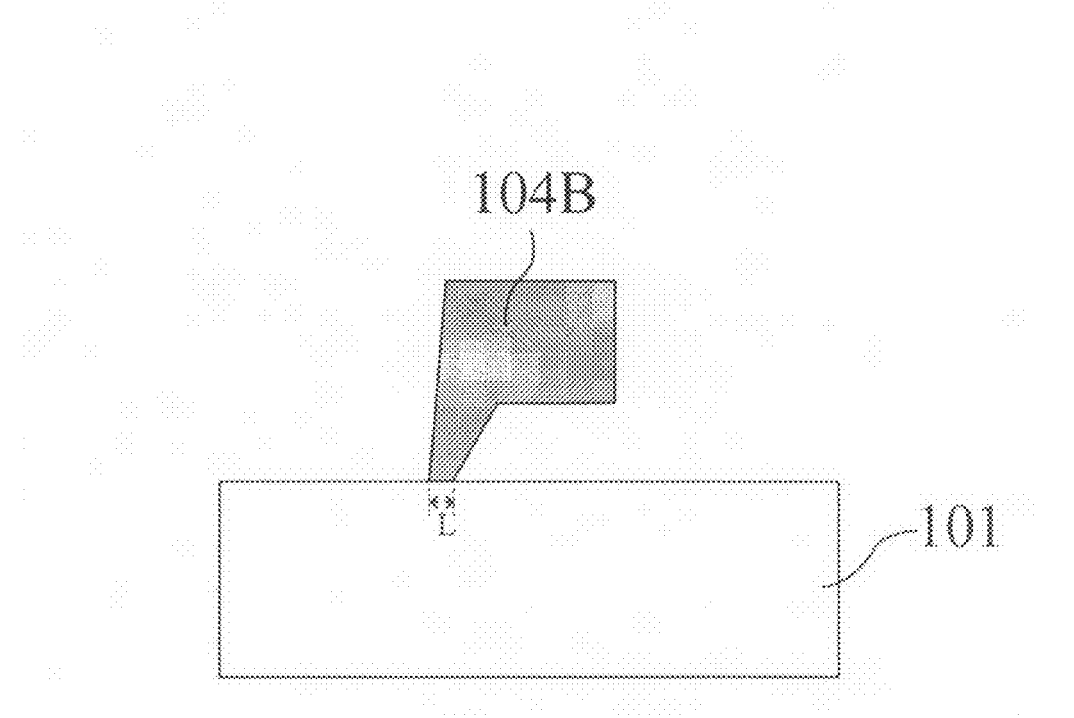

As shown in FIG. 1F, lift-off process will be performed; therefore, the first photoresist layer 102, the second photoresist layer 103 and the first portion of metal layer 104A all will be removed. Finally, the Γ-shaped metal gate 104B having bottom line-width L can be formed. The Γ-shaped metal gate is formed as the metal electrode, and can be applied to the fabrication of electronic devices such as GaAs or other compound semiconductor devices for high-frequency applications.

In another embodiment, the method for forming semiconductor structure with deep sub-micron or nano scale line-width is disclosed as followings.

Figure 2A:
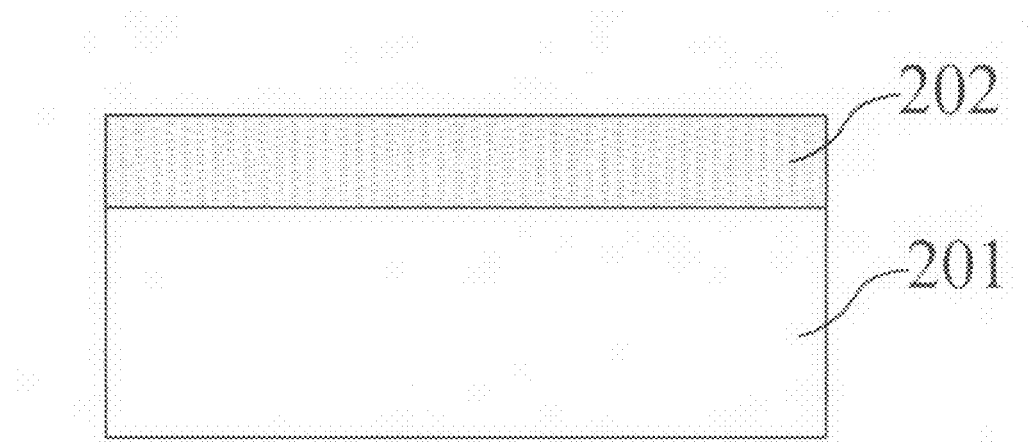
FIGS. 2A to 2G are the production process schematically illustrating the second embodiment of the invention.

As FIG. 2A, firstly, after considering the materials character and photo sensitivity, a suitable photoresist is selected for the first photoresist layer 202 which is formed on the semiconductor substrate 201 by the coating process.

Figure 2B:
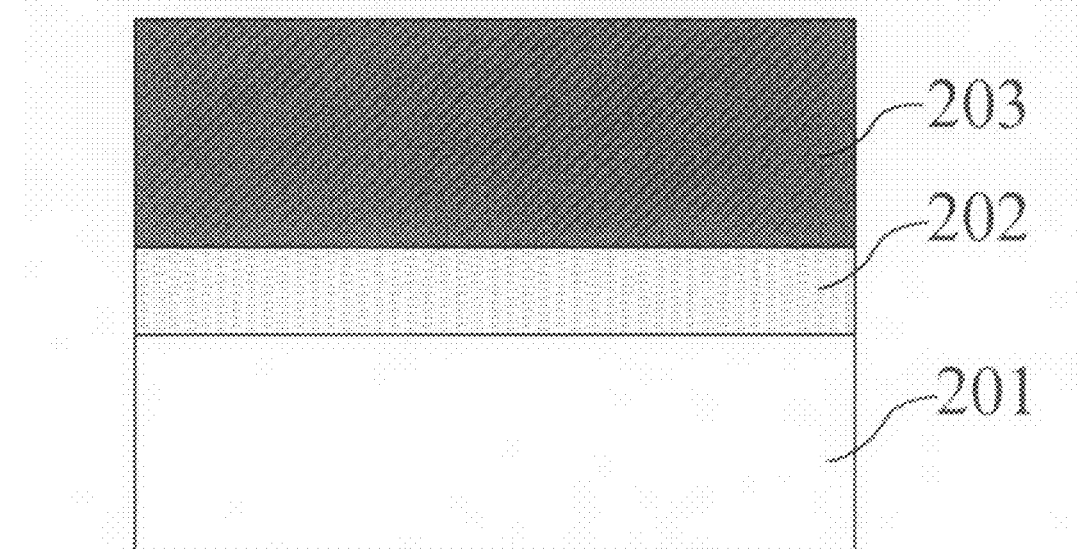

As shown in FIG. 2B, secondly, after considering the materials character and photo sensitivity, a suitable photoresist is selected for the second photoresist layer 203. The second photoresist layer 203 is formed on the first photoresist layer 202 by the coating process. Here, the materials character and photo sensitivity for the first photoresist 202 is different with that of the second photoresist layer 203.

Figure 2C:
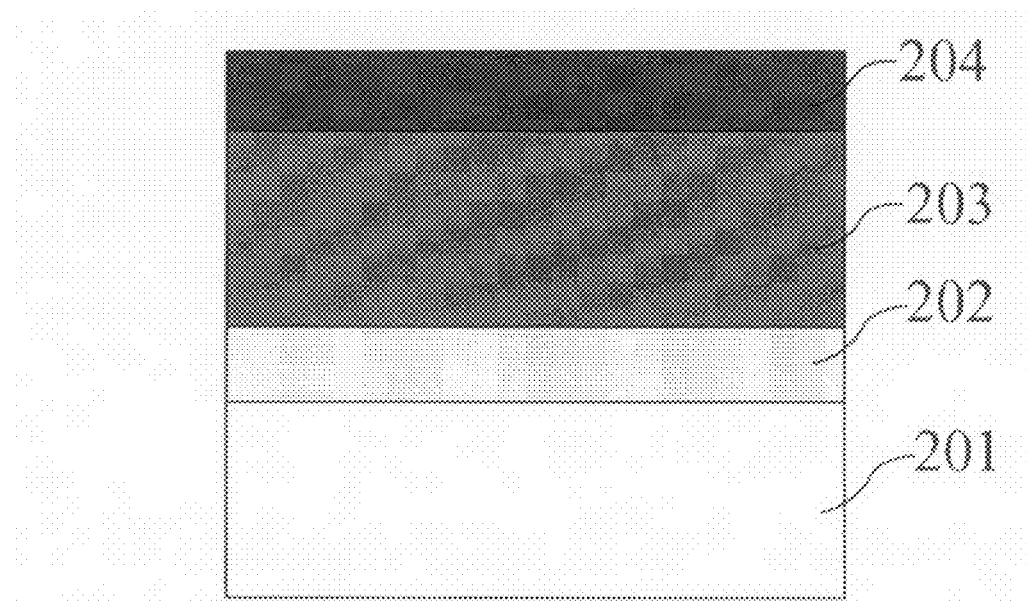

Next, as shown in FIG. 2C, after considering the materials character and photo sensitivity, a suitable photoresist is selected for the third photoresist layer 204. The third photoresist layer 204 is formed on the second photoresist layer 203 by the coating process. Here, the materials character and photo sensitivity for the third photoresist 204 is different with that of the second photoresist layer 203.

Figure 2D:
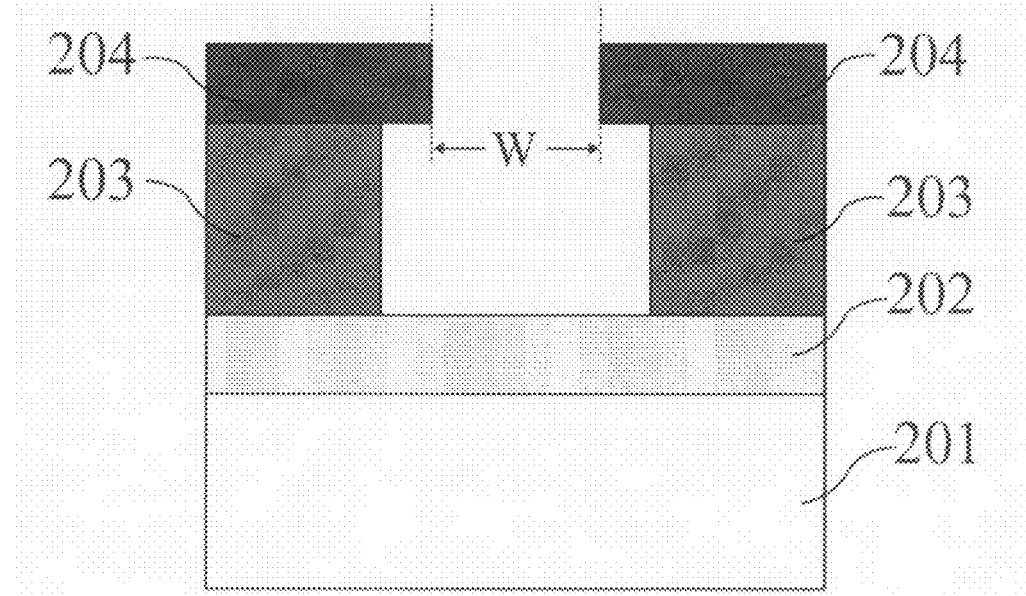

As shown in FIG. 2D, the exposure procedure of the selective developing process will be carried out. Controlling the expose energy, the expose dose is higher than the critical expose dose of the second photoresist layer 203 and the third photoresist layer 204 but lower than the critical expose dose of the first photoresist layer 202. The first photoresist layer 202 will not be developed after the second photoresist 203 and the third photoresist layer 204 being adequately developed and forming an under-cut photoresist groove having a top opening of W.

Figure 2E:
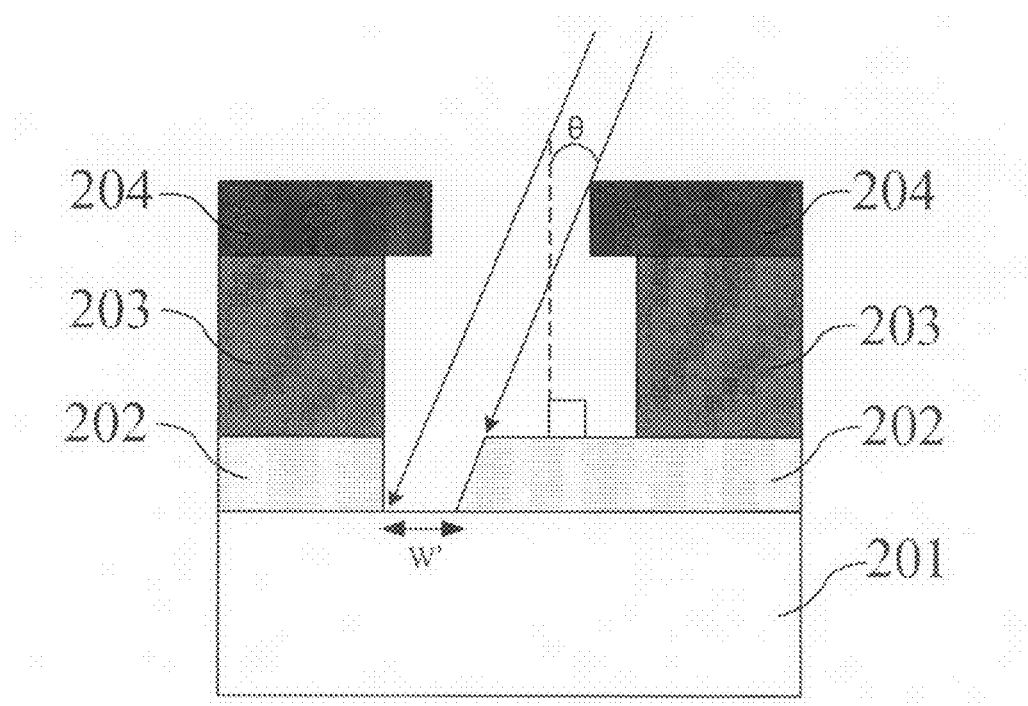

As shown in FIG. 2E, anisotropic etching will be carried out using dry etching with a proper angle, such as a controlled tilt-angle θ, i.e. there is an included angle to a normal line of the substrate surface. The first photoresist layer 202 is etched using the second photoresist layer 203 and the third photoresist layer 204 as the mask, so that a bottom photoresist groove with feature size of $W'$ can be obtained, wherein $W'$ is smaller than W.

Figure 2F:
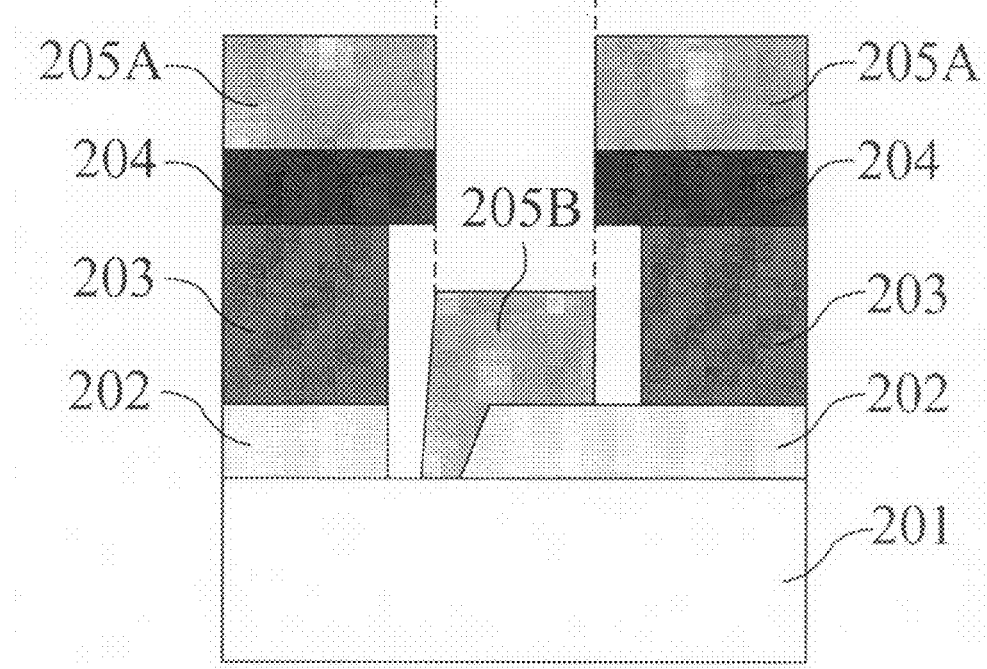

Next, as shown in FIG. 2F, the metal evaporation process is carried out by using equipments such as Electron Beam Evaporator for forming the first portion of metal layer 205A and the second portion of metal layer 205B. Wherein, the first portion of metal layer 205A will cover the surface of the third photoresist layer 204, the second portion of metal layer 205B will cover the surface of first photoresist layer 202 and the surface of the semiconductor substrate 201.

Figure 2G:
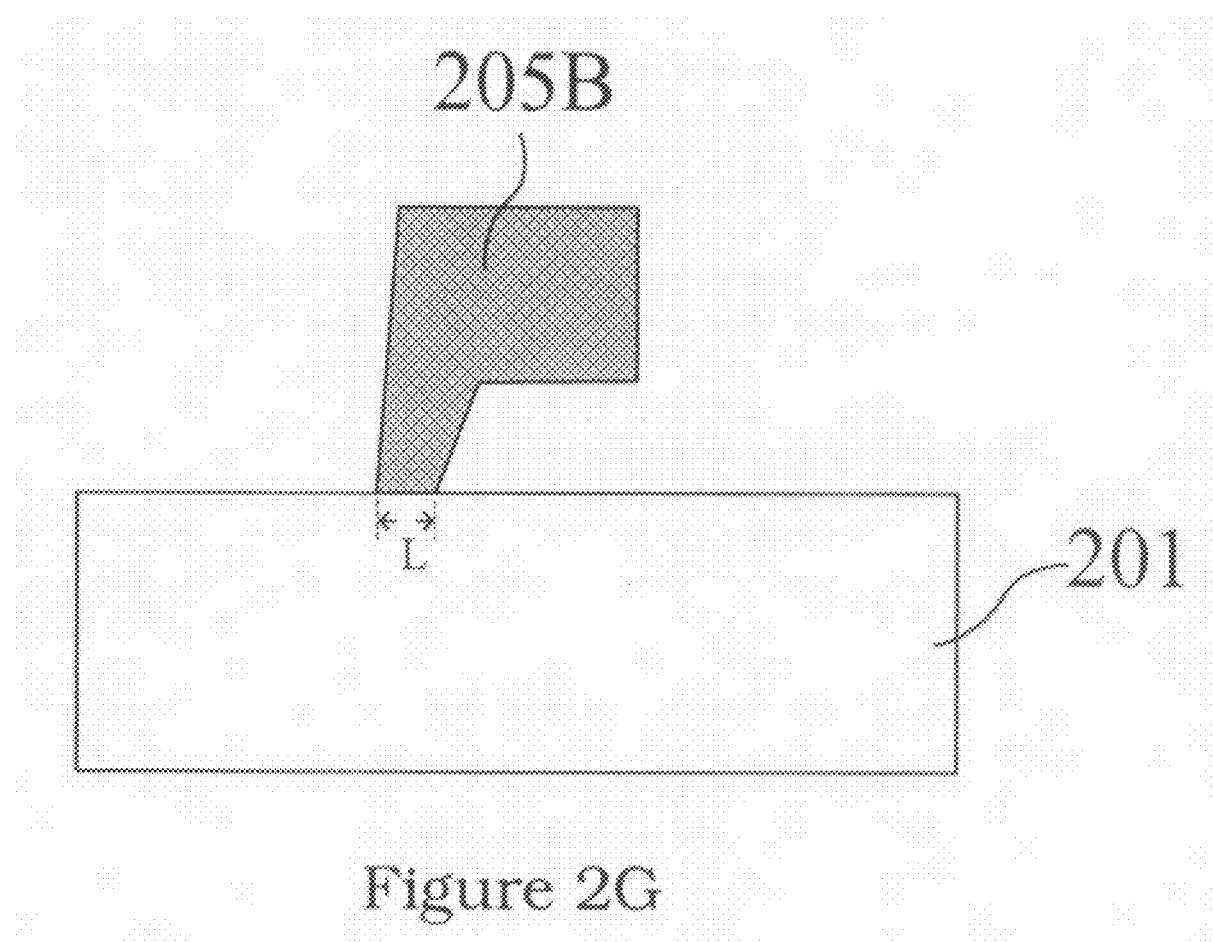

As shown in FIG. 2G, lift-off process will be performed; therefore, the first photoresist layer 202, the second photoresist layer 203, the third photoresist layer 204, and the first portion of metal layer 205A all will be removed. Finally, the Γ-shaped metal gate 205B having bottom line-width L can be formed. The Γ-shaped metal gate is formed as the metal electrode, and can be applied to the fabrication of electronic devices such as GaAs or other compound semiconductor devices for high-frequency applications.

Therefore, the invention can achieve the deep sub-micron scale or the nano scale semiconductor structures; and can be applied to the manufacture of deep sub-micron or nano-scale high-speed electronic components. This method provides a simple and cost-effective process for the fabrication of Γ-shaped gate with deep sub-micron gate length by simply using conventional optical lithography and anisotropic etching process with a tilt angle.

In the summary, the method for forming the deep sub-micron or nano scale line-width semiconductor structures is disclosed as followings.

In the first embodiment of the invention, a suitable photoresist is selected for the first photoresist layer, which is formed on the semiconductor substrate by the coating process. Secondly, a suitable photoresist is selected for the second photoresist layer, which is formed on the first photoresist layer by the coating process. Then, exposure procedure and selective developing process is carried out. The first photoresist layer will not be developed after the second photoresist being adequately developed and forming an under-cut photoresist groove. Then, anisotropic etching is carried out using dry etching with a proper angle, such as a controlled tilt-angle, there is an included angle to a normal line of the substrate surface; the first photoresist layer is etched using the second photoresist layer as the mask so that a bottom photoresist groove with smaller feature size can be obtained. Finally, the metal evaporation process and the lift-off process are carried out. The first photoresist layer, the second photoresist layer and part of the metal layer all will be removed and the Γ-shaped metal gate with deep sub-micron or nano scale line-width can be formed.

In another embodiment of the invention, a suitable photoresist is selected for the first photoresist layer, which is formed on the semiconductor substrate by the coating process. Secondly, a suitable photoresist is selected for the second photoresist layer, which is formed on the first photoresist layer by the coating process. Thirdly, a suitable photoresist is selected for the third photoresist layer, which is formed on the second photoresist layer by the coating process. Then, exposure procedure and selective developing process is carried out. The first photoresist layer will not be developed after the second and third photoresist being adequately developed and forming an under-cut photoresist groove. Then, anisotropic etching is carried out using dry etching with a proper angle, such as a controlled tilt-angle, i.e. there is an included angle to a normal line of the substrate surface; the first photoresist layer is etched using the second photoresist layer and the third photoresist layer as the mask so that a bottom photoresist groove with smaller feature size can be obtained. Finally, the metal evaporation process and the lift-off process are carried out. The first photoresist layer, the second photoresist layer, the third photoresist layer and part of the metal layer all will be removed and the Γ-shaped metal gate with deep sub-micron or nano scale line-width can be formed.

What is claimed is:

1. A method for forming a semiconductor structure having a deep sub-micron or nano scale feature size, comprising:
    providing a semiconductor substrate;
    forming a first photoresist layer on said semiconductor substrate;
    forming a second photoresist layer on said first photoresist layer;
    forming a third photoresist layer on said second photoresist layer;
    carrying out an exposure procedure on said first, second and third Photoresist layers with a proper exposure energy;
    developing said second and said third photoresist layers while not developing said first photoresist layer to form a first resist groove on said substrate; and
    carrying out an anisotropic etching process on said first resist groove with a proper angle to a normal line for a surface of said semiconductor substrate to form a second resist groove.

2. The method for forming a semiconductor structure according to claim 1, wherein said first resist groove is under-cut structure.

3. The method for forming a semiconductor structure according to claim 1, wherein said anisotropic etching comprises dry etching.

4. The method for forming a semiconductor structure according to claim 1, wherein said proper angle comprises an included angle.

5. The method for forming a semiconductor structure according to claim 1, further comprising:
    depositing metal layer on said substrate with said second resist groove; and
    removing said first photoresist layer, said second photoresist layer, said third photoresist layer and part of said metal layer to form a metal electrode.

6. The method for forming a semiconductor structure according to claim 5, wherein said metal layer comprises multiple metal elements.

7. The method for forming a semiconductor structure according to claim 5, wherein said removing process comprises a lift-off process.

* * * * *